United States Patent
Song

(10) Patent No.: US 9,006,973 B2
(45) Date of Patent: Apr. 14, 2015

(54) LIGHT EMITTING DEVICE

(75) Inventor: Ho Young Song, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 624 days.

(21) Appl. No.: 13/229,152

(22) Filed: Sep. 9, 2011

(65) Prior Publication Data

US 2012/0062115 A1    Mar. 15, 2012

(30) Foreign Application Priority Data

Sep. 10, 2010   (KR) .................. 10-2010-0089048

(51) Int. Cl.
*H05B 37/02* (2006.01)
*H01L 25/16* (2006.01)
*H01L 33/48* (2010.01)

(52) U.S. Cl.
CPC ............ *H01L 25/167* (2013.01); *H01L 33/486* (2013.01); *H01L 2924/0002* (2013.01)

(58) Field of Classification Search
CPC ..... H01L 25/167; H01L 33/486; H05B 37/02
USPC .................................. 315/51, 291, 297, 307
See application file for complete search history.

(56) References Cited

U.S. PATENT DOCUMENTS

| | | | |
|---|---|---|---|
| 6,333,522 B1 | 12/2001 | Inoue et al. | |
| 7,329,905 B2 | 2/2008 | Ibbetson et al. | |
| 2006/0006404 A1 | 1/2006 | Ibbetson et al. | |
| 2006/0163589 A1 | 7/2006 | Fan et al. | |
| 2007/0246716 A1 | 10/2007 | Bhat et al. | |
| 2007/0253209 A1 | 11/2007 | Loh et al. | |
| 2007/0257901 A1 | 11/2007 | Gotou et al. | |
| 2008/0012125 A1 | 1/2008 | Son | |
| 2008/0290353 A1 | 11/2008 | Medendorp, Jr. et al. | |
| 2011/0037082 A1* | 2/2011 | Doan et al. ..................... | 257/89 |

FOREIGN PATENT DOCUMENTS

| | | |
|---|---|---|
| CN | 1828921 A | 9/2006 |
| CN | 101032034 A | 9/2007 |
| CN | 101142692 A | 3/2008 |
| CN | 101154656 A | 4/2008 |
| CN | 101432896 A | 5/2009 |
| JP | 2004-320024 | 11/2004 |

(Continued)

OTHER PUBLICATIONS

Chinese Office Action, w/ English translation thereof, issued in Chinese Patent Application No. CN 201110276376.1 dated Oct. 18, 2013.

(Continued)

*Primary Examiner* — Jimmy Vu
(74) *Attorney, Agent, or Firm* — McDermott Will & Emery LLP

(57) ABSTRACT

A light emitting device includes: a substrate having opposed first and second main faces; a light emitting element mounted on the first main face of the substrate; and a driver integrated circuit (IC) formed in an area corresponding to a lower side of the light emitting element within the substrate, and adjusting the amount of current applied to the light emitting element. Since the circuit provided to drive a light emitting diode (LED) is integrated within the substrate, a compact light emitting device having an integrated structure can be obtained.

16 Claims, 10 Drawing Sheets

(56) References Cited

FOREIGN PATENT DOCUMENTS

| | | |
|---|---|---|
| JP | 2009-158505 | 7/2009 |
| KR | 10-2006-0004504 A | 1/2006 |
| KR | 10-0643723 | 11/2006 |
| KR | 10-2007-0041729 A | 4/2007 |
| KR | 10-2007-0079956 A | 8/2007 |
| WO | WO 03/086023 A1 | 10/2003 |
| WO | 2006/095949 A1 | 9/2006 |

OTHER PUBLICATIONS

Chinese Office Action issued in Chinese Application No. 201110276376.1 dated Jun. 26, 2014, w/English translation.
European Search Report issued in European Application No. 11180601.4 dated May 14, 2014.
Chinese Office Action dated Dec. 22, 2014 issued in corresponding Chinese Patent Application No. 201110276376.1 (English translation).

* cited by examiner

A-A'

B-B'

C-C'

LIGHT EMITTING DEVICE

CROSS-REFERENCE TO RELATED APPLICATIONS

This application claims the priority of Korean Patent Application No. 10-2010-0089048 filed on Sep. 10, 2010, in the Korean Intellectual Property Office, the disclosure of which is incorporated herein by reference.

BACKGROUND OF THE INVENTION

1. Field of the Invention

The present invention relates to a light emitting device.

2. Description of the Related Art

A light emitting diode, a type of semiconductor light emitting device, is a semiconductor device capable of generating light of various colors according to electron hole recombination in p and n type semiconductor junction parts when an electrical current is applied thereto. Compared with a filament-based light emitting device, the semiconductor light emitting device has various advantages such as a long life span, low power consumption, excellent initial driving characteristics, high vibration resistance, and the like, and thus, demand for the semiconductor light emitting device continues to grow. In particular, recently, a group III-nitride semiconductor capable of emitting short-wavelength blue light has come to prominence.

In an illumination device, or the like, an advantage obtained by replacing an existing light source with an LED is that a device having a slimmer design can be realized, and to this end, efforts at reducing the size of peripheral circuits or elements provided to drive the LED have been accelerated.

SUMMARY OF THE INVENTION

An aspect of the present invention provides a light emitting device which is reduced in size and has an integral structure by integrating a circuit provided for driving light emitting diodes (LEDs) within a substrate.

According to an aspect of the present invention, there is provided a light emitting device including: a substrate having opposed first and second main faces; a light emitting element mounted on the first main face of the substrate; and a driver integrated circuit (IC) formed in an area corresponding to a lower side of the light emitting element within the substrate, and adjusting the amount of current applied to the light emitting element.

The substrate may be made of a silicon semiconductive material.

The light emitting element may include a pair of electrodes disposed to face the substrate.

The light emitting device may further include a conductive via extending from the first main face to the second main face and made of a material different from that of the substrate.

The light emitting device may further include an insulator interposed between the substrate and the conductive via.

The driver IC may include a pair of external input terminals disposed in the direction of the first main face, and the external input terminals and the conductive via may be connected through a wiring structure formed on the first main face.

The driving IC may include a pair of control signal input terminals.

The driver IC may include a pair of element connection terminals connected to the light emitting element.

The light emitting device may further include a lens disposed on the first main face of the substrate.

The light emitting device may further include a controller IC and a power IC.

The light emitting device may further include a wiring structure connecting the controller IC and the power IC, and the wiring structure may be formed on at least one of the first and second main faces.

The light emitting device may further include a heat dissipating unit (or heat sinking unit) disposed at a lower side of the light emitting element such that it penetrate the substrate.

The driver IC may be formed to encompass the heat dissipating unit.

The substrate may have a cavity formed therein by removing a portion of the first main face, and the light emitting element may be disposed in the cavity.

The light emitting device may further include a reflective portion disposed at least in the area of the substrate in which the cavity is formed.

The reflective portion may be made of a conductive material, and the light emitting element may be connected to the driver IC by the reflective portion.

According to an aspect of the present invention, there is provided a light emitting device including: a substrate having opposed first and second main faces; a light emitting element mounted on the first main face of the substrate; and a driver integrated circuit (IC) formed within the substrate and adjusting the amount of current applied to the light emitting element; a controller IC formed within the substrate and connected to the driver IC; and a power IC formed within the substrate and connected to the controller IC.

The light emitting device may further include a wiring structure formed on at least one of the first and second main faces and connecting at least two of the light emitting element, the driver IC, the controller IC, and the power IC.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
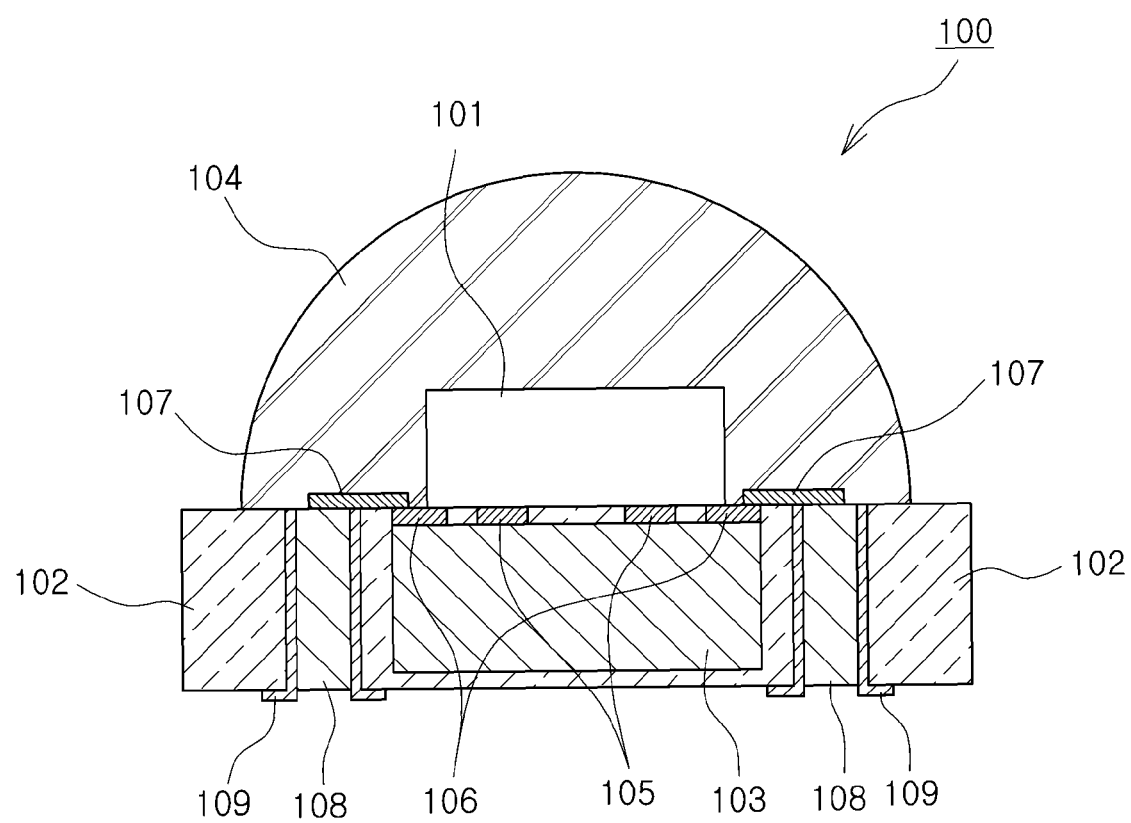
FIG. 1 is a cross-sectional view schematically showing a light emitting device according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
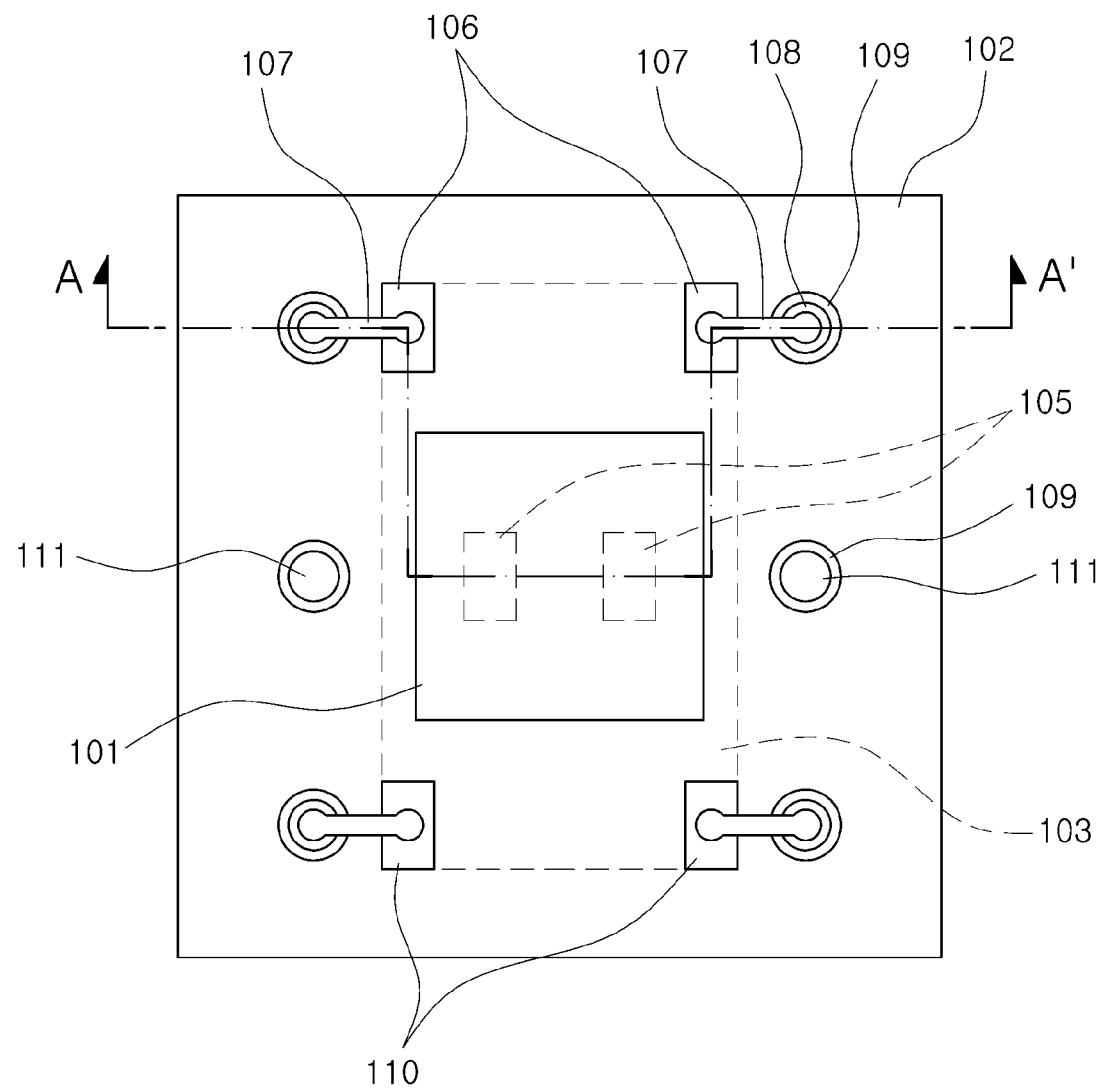
FIG. 2 is a schematic plan view of the light emitting device of FIG. 1 viewed from above.
Figure 3:
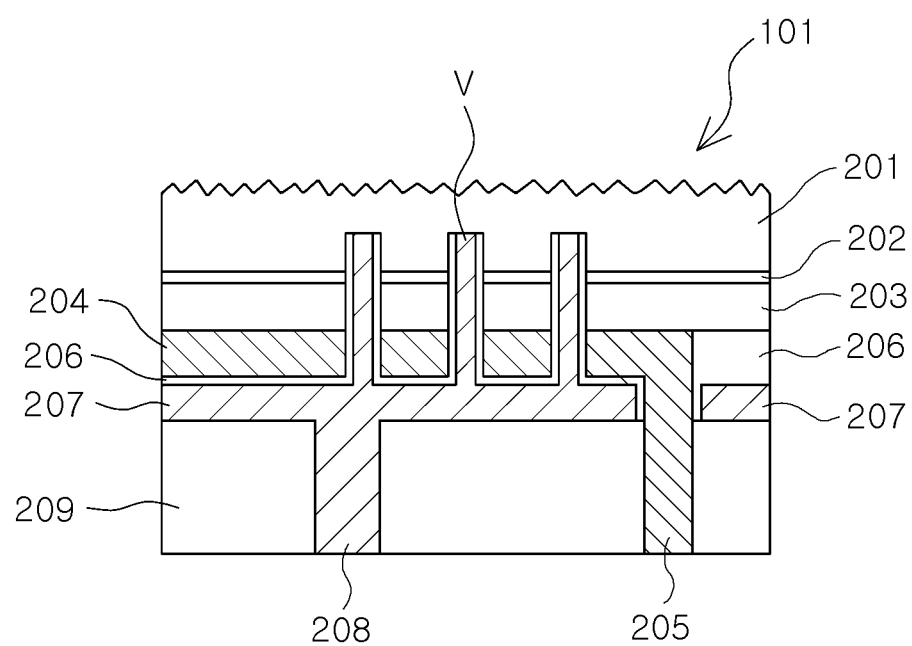
FIGS. 3 and 4 are cross-sectional views schematically showing an example of a light emitting element employed in the light emitting device of FIG. 1.
Figure 4:
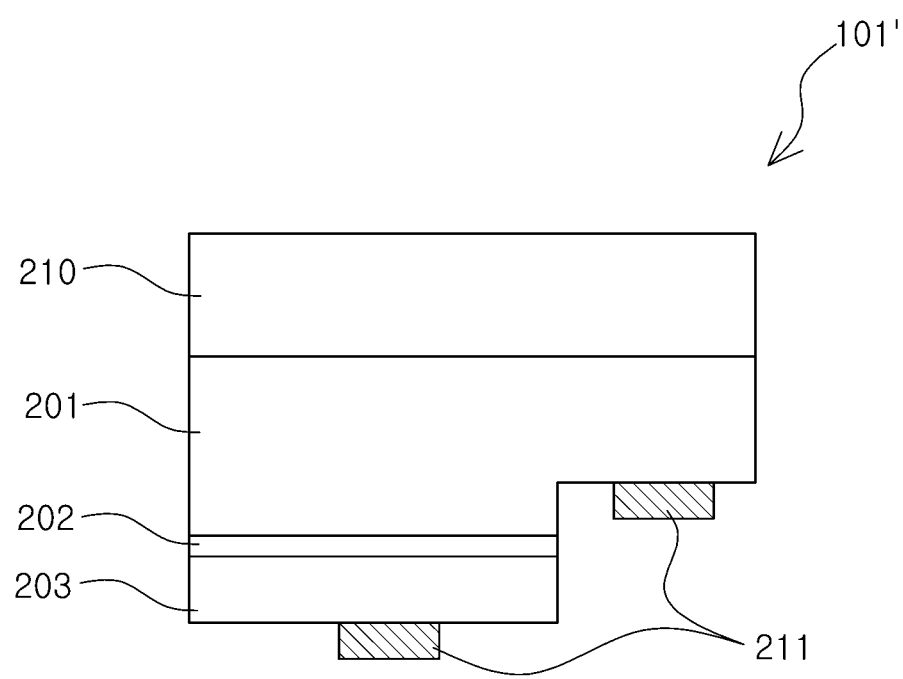

FIG. 1 is a cross-sectional view schematically showing a light emitting device according to an embodiment of the present invention. FIG. 2 is a schematic plan view of the light emitting device of FIG. 1 viewed from above. FIGS. 3 and 4 are cross-sectional views schematically showing an example of a light emitting element employed in the light emitting device of FIG. 1.

First, with reference to FIGS. 1 and 2, a light emitting device 100 according to the present embodiment includes a substrate 102, a light emitting element (e.g., a light emitting diode (LED)) 101, a driver integrated circuit (IC) 103, and a lens 104. In the present embodiment, the substrate 102 is a semiconductor substrate which is mainly made of a silicon semiconductive material, used to form a driver integrated circuit (IC) 103 (indicated by the dotted line in FIG. 2) within the substrate 102 by using a semiconductor integration process. The substrate 102 has first and second main faces which oppose each other, and the light emitting element 101 is disposed on the first face. The light emitting element 101 may be electrically connected to the driver IC 103 through a pair of element connection terminals 105 and may have a light emitting diode (LED) structure having a form such as that illustrated in FIGS. 3 and 4; however, the present invention is not limited thereto.

First, in the case of the LED 101 of FIG. 3, a first conductive contact layer 204 is formed on the device substrate 209, and a light emitting structure, namely, a structure including a first conductive semiconductor layer 203, an active layer 202, and a second conductive semiconductor layer 201, is formed on the first conductive contact layer 204. A second conductive layer 207 is formed between the first conductive contact layer 204 and the device substrate 209 and electrically connected to the second conductive semiconductor layer 201 through a conductive via V. The first and second conductive contact layers 204 and 207 are electrically separated, and to this end, an insulator 206 is interposed between the first and second conductive contact layers 204 and 207. Also, the first conductive contact layer 204 includes a first electrical connection portion 205 extending toward the device substrate 209 so as to be exposed to the outside, and similarly, the second conductive contact layer 207 includes a second electrical connection portion 208 extending toward the device substrate 209 so as to be exposed to the outside. In order to have such a structure, the first conductive contact layer 204 may be formed on a through hole formed on the second conductive contact layer 207, and the insulator 206 is formed at the through hole to electrically separate the first and second conductive contact layers 204 and 207. Also, as shown in FIG. 3, the first and second conductive contact layers 204 and 207 may be formed in through holes formed in the device substrate 209.

In the case of the LED 101 of FIG. 3, the first and second electrical connection portions 205 and 208 are exposed from a lower portion of the element, and may be connected to the driver IC 103 by the pair of element connection terminals 105. To this end, the first and second electrical connection portions 205 and 208 may be disposed to face the first main face. In this manner, since the device substrate 209 may not be used as an electrode, an electrically insulating substrate may be used as the device substrate 209, and one of substrates made of ceramic, sapphire, and the like, may be appropriately selected in consideration of characteristics such as heat conductivity, thermal expansion coefficient, and the like. Besides the electrically insulating substrate, the device substrate 209 may also be made of a conductive material. For example, a substrate made of a material including any one of gold (Au), nickel (Ni), aluminum (Al), copper (Cu), tungsten (W), silicon (Si), selenium (Se), and gallium arsenide (GaAs) may be used. Although not shown in FIG. 3, when the device substrate 209 is made of a conductive material, the insulator 206 may be formed between the device substrate 209 and the first conductive contact layer 207. When the electrode is exposed from a lower portion of the element as in the present embodiment, the LED 101 may be directly mounted on the substrate, a lead frame or the like, and the omission of a conductive wire provides advantages in the aspect of reliability, light extraction efficiency, process convenience, and the like.

An LED 101' of FIG. 4 includes a growth substrate 210 such as a sapphire substrate and has a so-called flip chip type mounting structure. Namely, a pair of electrodes 211 are connected to first and second conductive semiconductor layers 203 and 201, respectively, and are disposed to face the first main face of the substrate 102 of FIG. 1. Meanwhile, in the case of the LEDs 101 and 101' of FIGS. 3 and 4, a wire is not used for an electrical connection structure toward the first face of the substrate 102, but the present invention is not limited thereto. Namely, although not shown, a structure in which the electrodes of the LEDs 101 and 101' face in opposite directions of the substrate 102 may be implemented, and in this case, a wire or any other type of wiring may be required. Also, although not shown, an irregular portion (i.e., a pattern of depressions and protrusions) may be formed on a light output face of the LEDs 101 and 101', and in addition, phosphor materials that convert the wavelength of light may be applied thereto. Meanwhile, in the structure of FIGS. 1 and 2, the light emitting device 100 includes only one light emitting device 101 but two or more light emitting elements may be provided, and accordingly, two or more driver ICs may be provided.

With reference to FIGS. 1 and 2, the driver IC 103 is integrated within the substrate 102 made of a semiconductive material. In detail, the drier IC 103 may be disposed at an area corresponding to a lower side of the light emitting element 101 and directly connected to the light emitting element 101 at the shortest distance. In the present embodiment, a circuit having an appropriate form may be implemented by using a semiconductor (e.g., silicon) integration process known in the art in the substrate 102, thus forming the driver IC 103. The driver IC 103 serves to adjust the intensity of light emitted from the light emitting element 101 by adjusting the current applied to the light emitting element 101, and to this end, the driver IC 103 may include a pair of external input terminals 106 for receiving an external electrical signal and a pair of control signal input terminals 110 for receiving a control signal of the light emitting element. Signals provided from the external input terminals 106 and the control signal input terminals 110 may be provided to the light emitting element 101 through the driver IC 103.

In this case, as shown in FIG. 2, the external input terminals 106 and the control signal input terminals 110 are connected to conductive vias 108 by means of a wiring structure 107, and the conductive vias 108 penetrate the substrate 102 from the first main face to the second main face of the substrate 102. The conductive vias 108 may be made of a metal such as gold (Au), silver (Ag), aluminum (Al), copper (Cu), nickel (Ni), or the like, having excellent electrical conductivity, and an insulator 109 may be interposed between the conductive vias 108 and the substrate 102. Although not a requirement, as shown in FIG. 2, a via type heat dissipating unit 111 penetrating the substrate 102 may be provided. In order to improve a heat dissipation effect (or heat sinking effect), the size of the heat dissipating unit 108 may be appropriately adjusted. For example, unlike the structure illustrated in FIG. 2, the heat dissipating unit 108 may be increased in size so as to be in contact with the light emitting element 101.

In this manner, in the present embodiment, the driver IC 103, which has been separately provided to drive the light emitting element 101, is integrated within the substrate 102, implementing a thinner light emitting device, and in addition, the circuit can be integrated within the substrate 102 in a simpler manner by using the semiconductor integration process. Here, in the present embodiment, only the drier IC 103 is integrated, but the present invention is not limited thereto and the light emitting device 100 may include various circuits and elements which can be integrated within the substrate 102 (e.g., a control integrated circuit, a power integrated circuit, please see the embodiment of FIG. 10).

Figure 5:
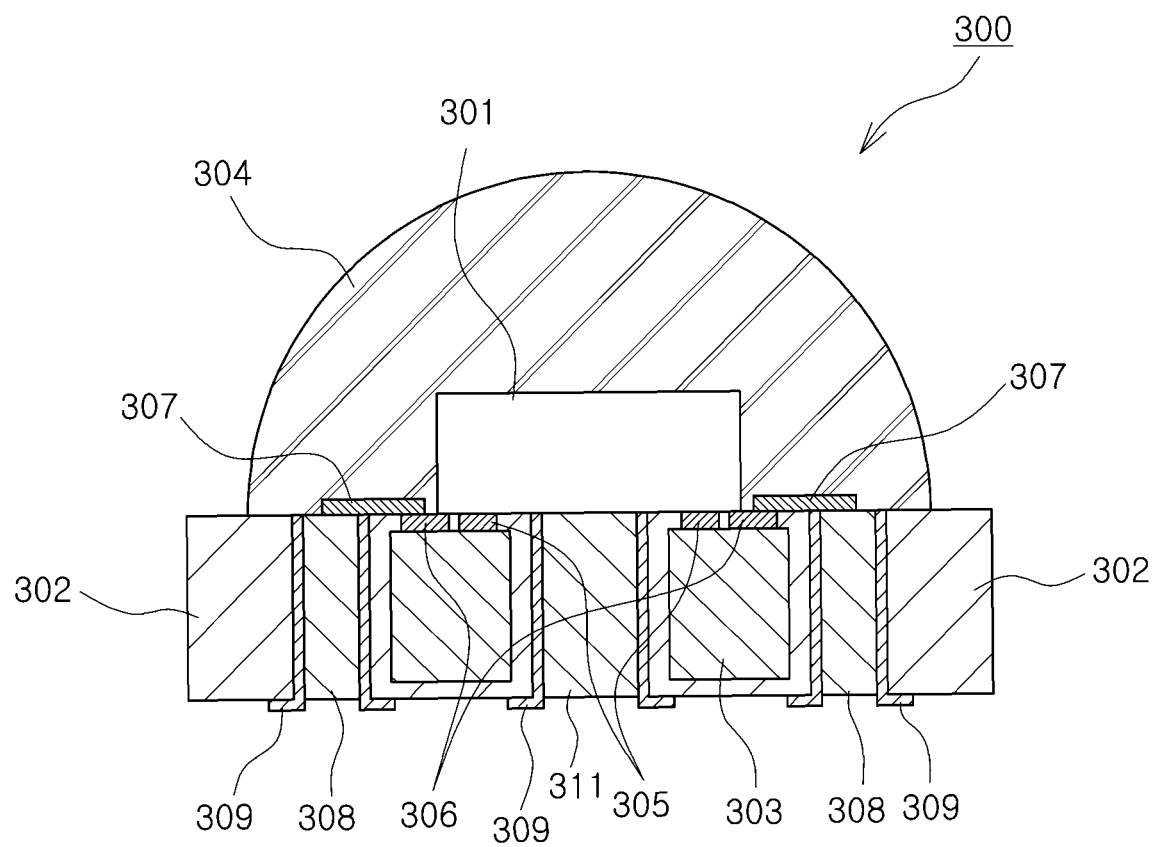
FIG. 5 is a cross-sectional view schematically showing a light emitting device according to an embodiment of the present invention.
Figure 6:
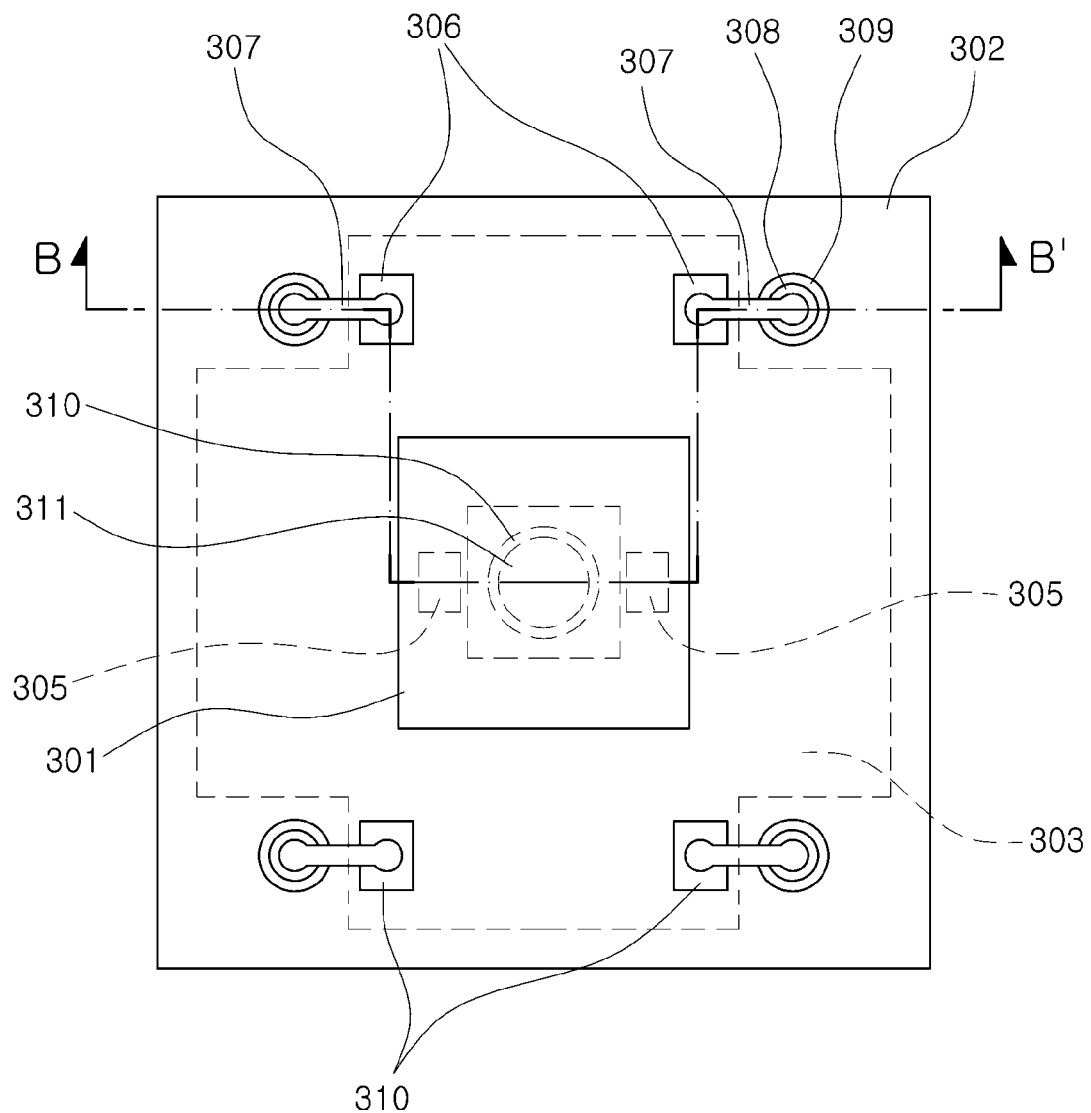
FIG. 6 is a schematic plan view of the light emitting device of FIG. 5 viewed from above.

FIG. 5 is a cross-sectional view schematically showing a light emitting device according to an embodiment of the present invention. FIG. 6 is a schematic plan view of the light emitting device of FIG. 5 viewed from above. With reference to FIGS. 5 and 6, a light emitting device 300 includes a substrate 302, a light emitting element 301, a driver IC 303, and a lens 304. Like the former embodiment, the driver IC 303 is integrated within the substrate 302 and may be connected to the light emitting element 301 through a pair of element connection terminals 305. Also, the driver IC 303 includes a pair of external connection terminals 306 and may be connected to conductive vias by means of a wiring structure 307. In this case, an insulator 309 may be disposed between the conductive via 308 and the substrate 302 in order to prevent an unintentional short-circuit therebetween.

The present embodiment is different from the former embodiment in that a heat dissipating unit 311 is disposed immediately under the light emitting element 301, and according to this structure, heat generated from the light emitting element 301 can be effectively dissipated to the outside. As the heat dissipating unit 301 is disposed immediately under the light emitting element 301, the driver IC 303 (indicated by the dotted line) is formed in an area corresponding to the lower side of the light emitting element 301 such that it encompasses the heat dissipating unit 311.

Figure 7:
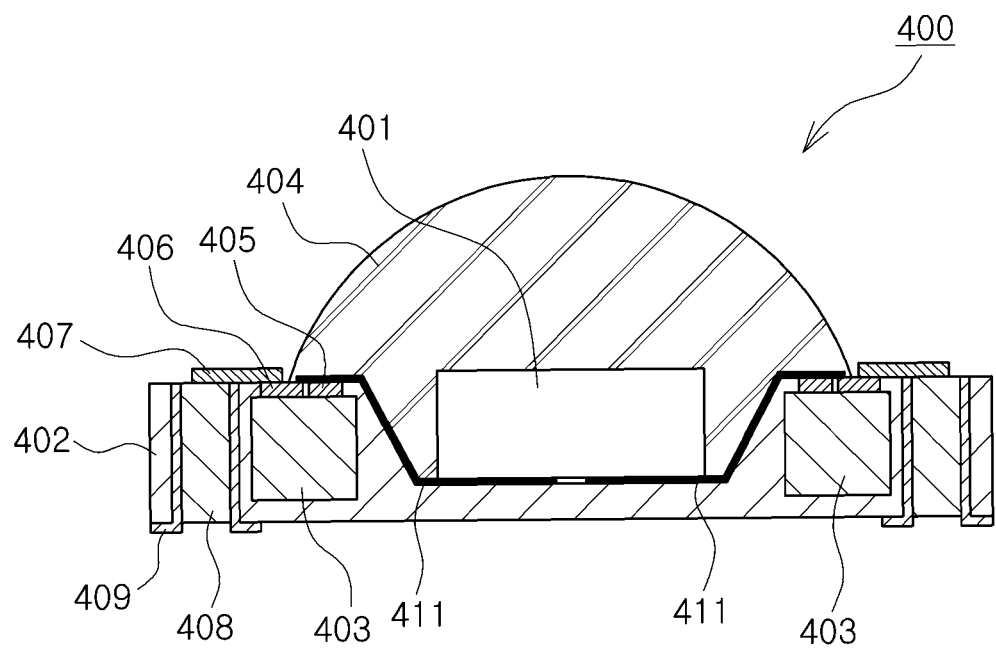
FIG. 7 is a cross-sectional view schematically showing a light emitting device according to an embodiment of the present invention.
Figure 8:
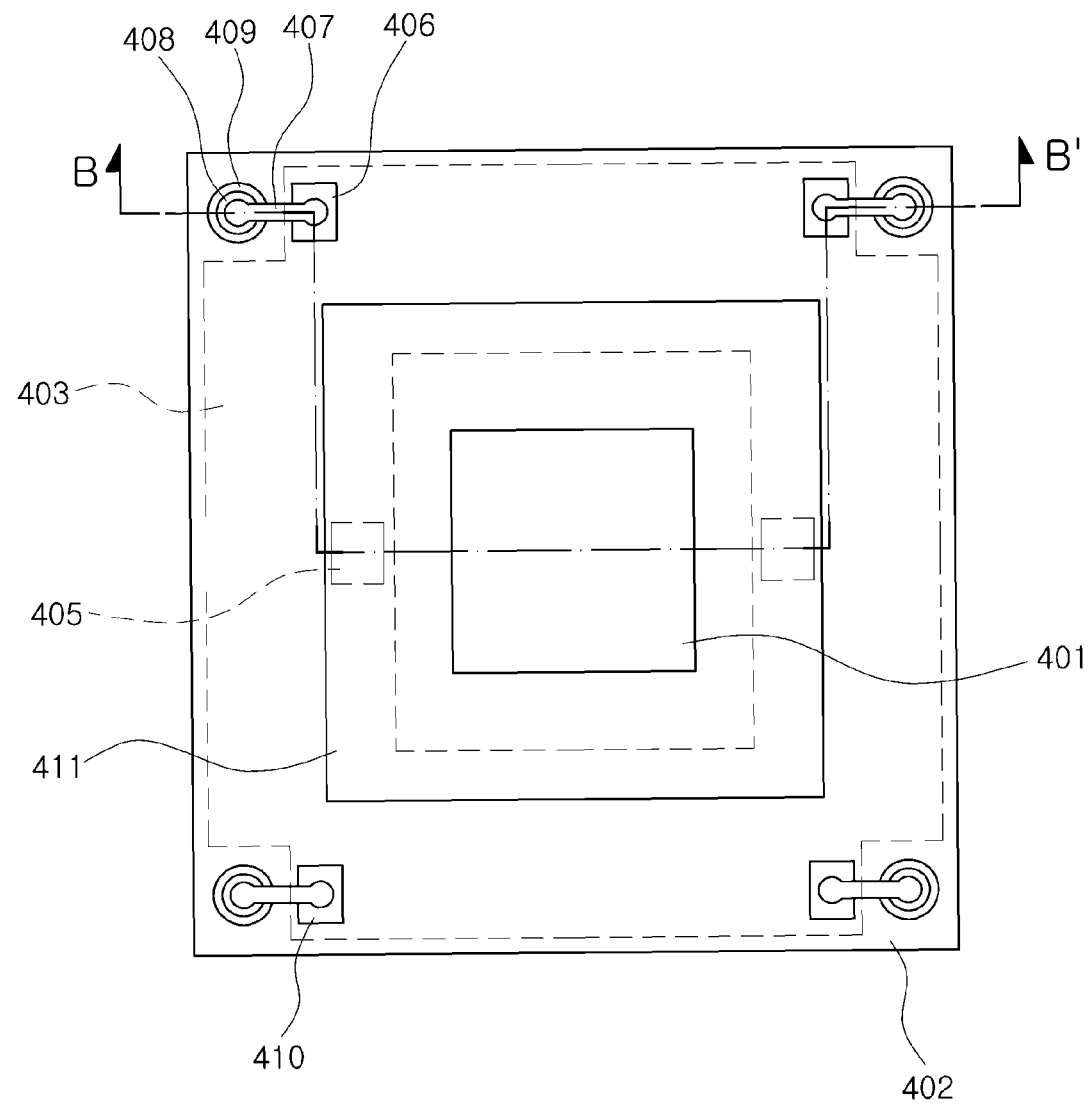
FIG. 8 is a schematic plan view of the light emitting device of FIG. 7 viewed from above.

FIG. 7 is a cross-sectional view schematically showing a light emitting device according to an embodiment of the present invention. FIG. 8 is a schematic plan view of the light emitting device of FIG. 7 viewed from above. With reference to FIGS. 7 and 8, a light emitting device 400 according to the present embodiment includes a substrate 402, a light emitting element 401, a driver IC 403, and a lens 404. Like the former embodiment, the driver IC 403 is integrated within the substrate 402. Also, the driver IC 403 includes a pair of external connection terminals 406 and is connected to a conductive via 408 by a wiring structure 407. In this case, an insulator 409 may be disposed between the conductive via 408 and the substrate 402 in order to prevent an unintentional short circuit.

In the present embodiment, the substrate 402 includes a cavity formed by removing a portion of the first main face, and the light emitting element 401 is disposed in the cavity. Since the light emitting element 401 is disposed in the cavity area of the substrate 402, the distance between the light emitting element 401 and the mounting face of the light emitting device 400, namely, the second main face of the substrate 402, is reduced, which is advantageous for heat dissipation in comparison to the former embodiment. Although not shown, a heat dissipating unit in the form of a via penetrating the substrate may be additionally formed in order to further improve the heat dissipation effect. Reflective portions 411 are disposed on inner walls of the cavity to upwardly reflect light emitted from the light emitting element 401, and with this structure, a desired orientation angle can be adjusted. Also, the reflective portions 411 may be made of a metal such as silver (Ag), gold (Au), aluminum (Al), copper (Cu), nickel (Ni), or the like, thereby having a structure in which the light emitting element 401 is connected to the driver IC 403 by the reflective portions 411.

Figure 9:
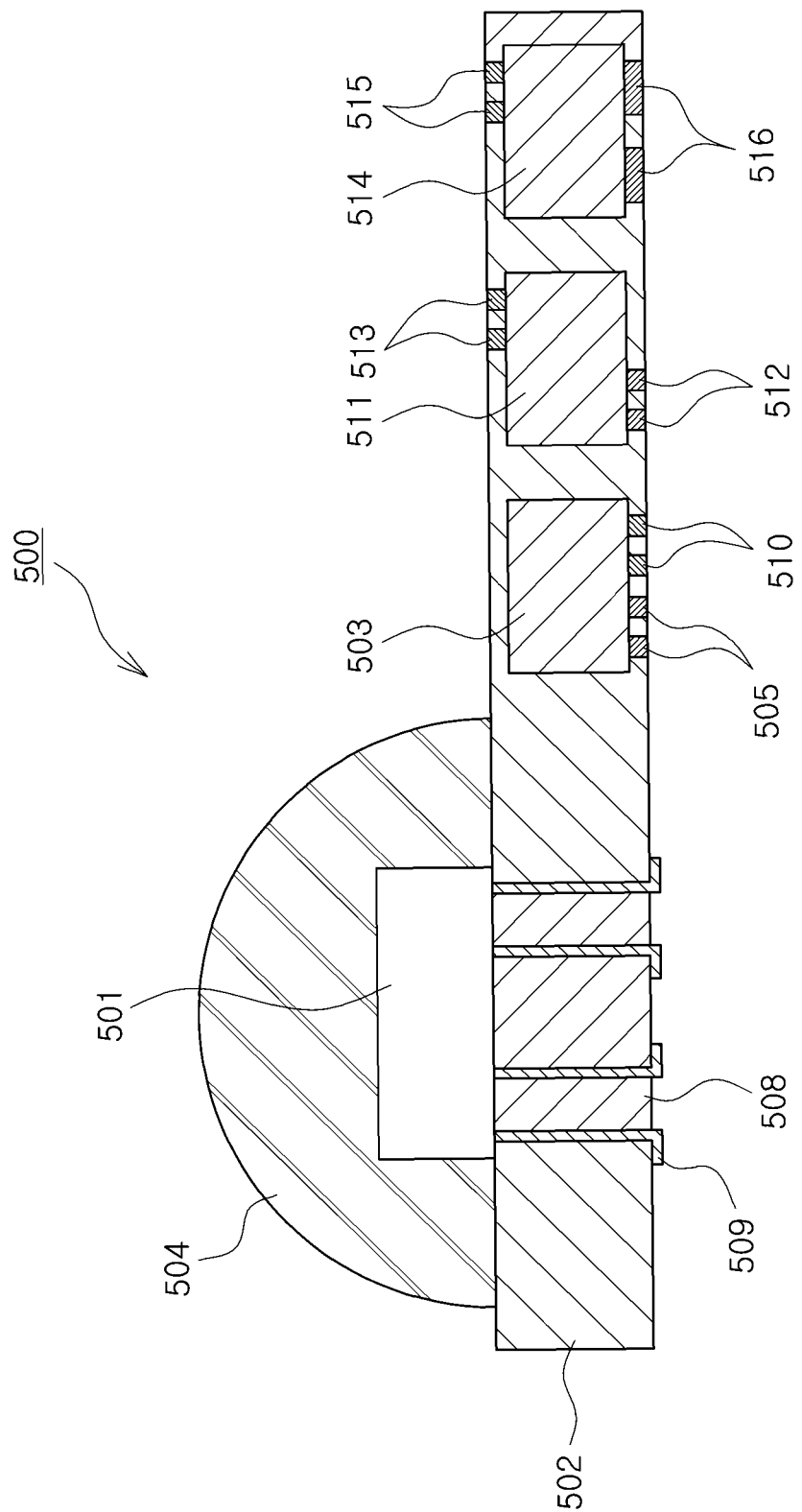
FIG. 9 is a cross-sectional view schematically showing a light emitting device according to an embodiment of the present invention.
Figure 10:
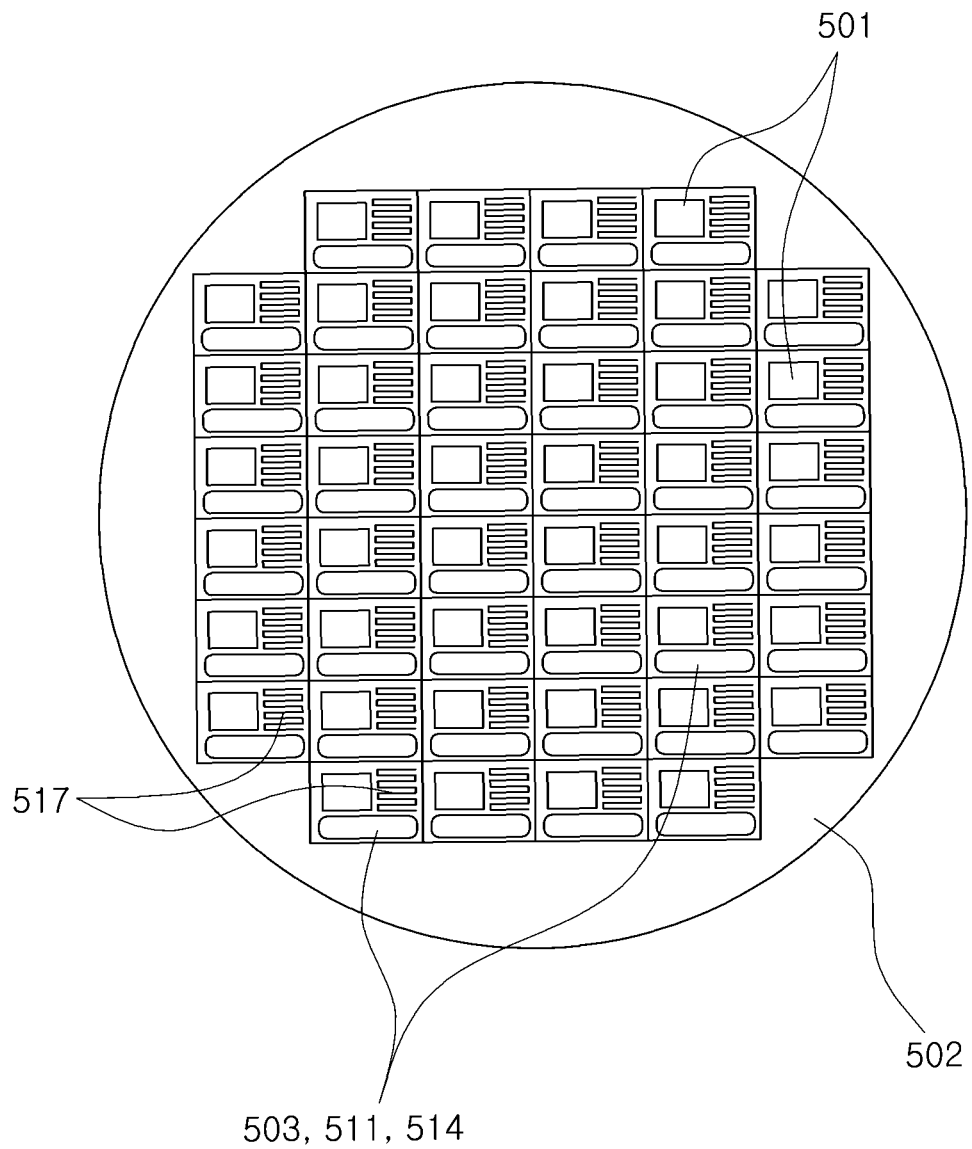
FIG. 10 is a schematic plan view of the light emitting device of FIG. 9 viewed from above.

FIG. 9 is a cross-sectional view schematically showing a light emitting device according to an embodiment of the present invention. FIG. 10 is a schematic plan view of the light emitting device of FIG. 9 viewed from above. FIG. 10 shows a structure in which a plurality of light emitting devices are provided in an array form.

With reference to FIGS. 9 and 10, a light emitting device 500 according to the present embodiment includes a substrate 502, a light emitting element 501, a driver IC 503, and a lens 504. Like the former embodiment, the driver IC 503 is integrated within the substrate 502. In the present embodiment, another IC required for driving the light emitting element 501 is provided in addition to the driver IC 503. In detail, a controller IC 511 and a power IC 514 are further integrated within the substrate 502. Like the driver IC 503, the controller IC 511 and the power IC 514 may be formed by implementing appropriate circuits by applying a semiconductor integration process to the substrate 502.

The controller IC 511 generates an electrical signal for controlling brightness, or the like, of the light emitting element 501, and a pair of terminals 512 may deliver a control signal to the driver IC 503, and another pair of terminals 513 may receive information regarding brightness of the light emitting element 501 from an external element (e.g., a sensor). In this case, of course, the external element may also be integrated within the substrate 502. The power IC 514 generates an appropriate current and voltage required for operating the light emitting element 501, and for example, serves to convert alternating current (AC) power into direct current (DC) power, or the like. Like the controller IC 511, the power IC 514 may have two pairs of terminals 515 and 516, and one of the two pairs of terminals 515 and 516 may be connected to an external power source and the other of the two pairs of terminals 515 and 516 may be connected to the driver IC 503. In this case, the light emitting element 501, the driver IC 503, the controller IC 511, and the power IC 514 may be appropriately connected by a wiring structure, and the wiring structure may be formed along at least one of the first and second main faces. FIG. 10 shows a wiring structure 517 formed on the first main face of the substrate 502.

As set forth above, according to embodiments of the invention, a light emitting device which is compact and has an integrated structure can be obtained by integrating circuits provided for driving an LED within a substrate.

While the present invention has been shown and described in connection with the embodiments, it will be apparent to those skilled in the art that modifications and variations can be made without departing from the spirit and scope of the invention as defined by the appended claims.

What is claimed is:

1. A light emitting device comprising:
a substrate having opposed first and second main faces;
a light emitting element mounted on the first main face of the substrate;

a driver integrated in the substrate in an area corresponding to a lower side of the light emitting element, and adjusting the amount of current applied to the light emitting element; and a conductive via extending from the first main face to the second main face and made of a material different from that of the substrate.

2. The light emitting device of claim 1, wherein the substrate is made of a silicon semiconductive material.

3. The light emitting device of claim 1, wherein the light emitting element comprises a pair of electrodes disposed to face the substrate.

4. The light emitting device of claim 1, further comprising an insulator interposed between the substrate and the conductive via.

5. The light emitting device of claim 1, wherein the driver comprises a pair of external input terminals disposed in the direction of the first main face, and the external input terminals and the conductive via are connected through a wiring structure formed on the first main face.

6. The light emitting device of claim 1, wherein the driver comprises a pair of control signal input terminals.

7. The light emitting device of claim 1, wherein the driver comprises a pair of element connection terminals connected to the light emitting element.

8. The light emitting device of claim 1, further comprising a lens disposed on the first main face of the substrate.

9. The light emitting device of claim 1, further comprising a controller and a power circuit.

10. The light emitting device of claim 9, further comprising a wiring structure connecting the controller and the power circuit, the wiring structure is formed on at least one of the first and second main faces.

11. The light emitting device of claim 1, further comprising a heat dissipating unit disposed at a lower side of the light emitting element such that the heat dissipating unit penetrates the substrate.

12. The light emitting device of claim 11, wherein the driver is formed to encompass the heat dissipating unit.

13. The light emitting device of claim 1, wherein the substrate has a cavity formed therein by removing a portion of the first main face, and the light emitting element is disposed in the cavity.

14. The light emitting device of claim 13, further comprising a reflective portion disposed at least in the area of the substrate in which the cavity is formed.

15. The light emitting device of claim 14, wherein the reflective portion is made of a conductive material, and the light emitting element is connected to the driver by the reflective portion.

16. A light emitting device comprising:

a substrate having opposed first and second main faces;

a light emitting element mounted on the first main face of the substrate;

a driver integrated in the substrate and adjusting the amount of current applied to the light emitting element;

a controller integrated in the substrate and connected to the driver;

a power circuit integrated in the substrate and connected to the controller; and a wiring structure formed on at least one of the first and second main faces and connecting at least two of the light emitting element the driver, the controller, and the power circuit.

* * * * *